United States Patent
Youn et al.

(10) Patent No.: US 7,451,366 B2
(45) Date of Patent: Nov. 11, 2008

(54) NONVOLATILE MEMORY DEVICES WITH TEST DATA BUFFERS AND METHODS FOR TESTING SAME

(75) Inventors: Dong-Kyu Youn, Gyeonggi-do (KR); Jin-Yub Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 341 days.

(21) Appl. No.: 11/005,546

(22) Filed: Dec. 6, 2004

(65) Prior Publication Data

US 2006/0053353 A1 Mar. 9, 2006

(30) Foreign Application Priority Data

Sep. 8, 2004 (KR) ............. 10-2004-0071797

(51) Int. Cl.
*G11C 29/00* (2006.01)
*G11C 7/00* (2006.01)

(52) U.S. Cl. .................. 714/718; 365/201
(58) Field of Classification Search ......... 714/718–723; 365/185.12, 238.5, 189.05, 201
See application file for complete search history.

(56) References Cited

U.S. PATENT DOCUMENTS

| | | | |
|---|---|---|---|
| 5,475,693 A * | 12/1995 | Christopherson et al. ... | 714/710 |
| 5,623,620 A * | 4/1997 | Fandrich et al. ............. | 711/202 |
| 5,748,939 A * | 5/1998 | Rozman et al. ............. | 711/103 |
| 5,954,828 A * | 9/1999 | Lin ............................. | 714/723 |
| 6,477,674 B1 | 11/2002 | Bates et al. | |
| 6,882,569 B2 * | 4/2005 | Hosono et al. ......... | 365/185.17 |
| 7,024,598 B2 * | 4/2006 | Jeong et al. ................. | 714/704 |
| 7,076,667 B1 * | 7/2006 | Gama et al. ................. | 713/193 |
| 2001/0017789 A1 * | 8/2001 | Noda ..................... | 365/185.12 |

(Continued)

FOREIGN PATENT DOCUMENTS

JP 06-058700 3/1994

(Continued)

OTHER PUBLICATIONS

"MirrorBit Flash Memory Write Buffer Programming and Page Buffer Read" Application Notes AMD Publication #25539 Rev A Amendment/0 Issue date Oct. 4, 2001.*

(Continued)

*Primary Examiner*—Cynthia Britt
(74) *Attorney, Agent, or Firm*—Myers Bigel Sibley & Sajovec, PA

(57) ABSTRACT

A memory device includes a non-volatile memory core that includes a memory cell array and a page buffer configured to store data to be programmed in the memory cell array. The device also includes a test data input buffer configured to receive test data from an external source, and control circuit that controls the non-volatile memory core and the test data input buffer. The control circuit is configured to load test data from the test data buffer to the page buffer, to program the loaded test data in the page buffer in the memory cell array, and to retain the test data in the page buffer for subsequent programming of the memory cell array. The device may further include a test data output buffer configured to receive data read from the memory cell array, and the control circuit may be operative to convey the read data from the test data output buffer to an external recipient.

15 Claims, 4 Drawing Sheets

U.S. PATENT DOCUMENTS

2001/0053092 A1 * 12/2001 Kosaka et al. .......... 365/185.19
2002/0069381 A1 * 6/2002 Jeong et al. ................. 714/704

FOREIGN PATENT DOCUMENTS

JP      11-258314       9/1999
JP      2001312900 A *  11/2001

OTHER PUBLICATIONS

"A Dual Page Programming Scheme for High-Speed Multi-Gb-Scale NAND Flash Memories" Takeuchi et al. 2000 Symposium on VLSI Circuits Digest of Technical Papers pp. 156-157.*

* cited by examiner

NONVOLATILE MEMORY DEVICES WITH TEST DATA BUFFERS AND METHODS FOR TESTING SAME

RELATED APPLICATION

This application claims priority of Korean Patent Application No. 2004-71797, filed on Sep. 8, 2004 in the Korean Intellectual Property Office, the disclosure of which is incorporated herein by reference in its entirety.

BACKGROUND OF THE INVENTION

The present invention relates to memory devices and, more particularly, to nonvolatile memory devices and test methods therefor.

As integration density of semiconductor memories has increased with the advance in semiconductor fabricating technologies, test time has tended to increase. The cost required for memory manufacturing processes generally has increased less than the cost of testing, thus increasing the significance of test costs in terms of total fabricating cost.

Typically, a test vector is applied to a memory device in order to verify normal function. Nonvolatile memory devices, such as flash memory devices, typically have longer data reading and writing times than other types of memory devices, which, combined with storage capability for a great volume of data, can result in relatively long test times for such devices. Therefore, it is generally desired to shorten test time for nonvolatile memory devices.

SUMMARY OF THE INVENTION

In some embodiments of the present invention, a memory device includes a non-volatile memory core that includes a memory cell array and a page buffer configured to store data to be programmed in the memory cell array. The device also includes a test data input buffer configured to receive test data from an external source, and a control circuit that controls the non-volatile memory core and the test data input buffer. The control circuit is configured to load test data from the test data buffer to the page buffer, to program the loaded test data in the page buffer in the memory cell array, and to retain the test data in the page buffer for subsequent programming of the memory cell array. The device may further include a test data output buffer configured to receive data read from the memory cell array, and the control circuit may be operative to convey the read data from the test data output buffer to an external recipient.

In some embodiments, the control circuit is operative to re-program memory cells in the memory cell array with the retained test data in the page buffer responsive to a programming failure. The control circuit may also be operative to program a first set of memory cells of the memory cell array with the loaded test data in the page buffer to test the first set of memory cells, and to program a second set of memory cells of the memory cell array with the retained test data to test the second set of memory cells. The page buffer may retain the test data until a reset inhibit function of the page buffer is deactivated.

According to further embodiments of the present invention, the control circuit is configured to store respective test data patterns in the test data input buffer. The control circuit may transfer multiple numbers of at least one of the test data patterns to the page buffer and may program the memory cell array with the multiple numbers of the at least one of the test data patterns.

In further embodiments, the control circuit includes an interface circuit configured to receive test data and one or more control signals from the external source. The control circuit also includes a control register configured to store the one or more control signals, a memory controller configured to program and read the non-volatile memory core, and a buffer controller configured to transfer test data among the interface circuit, the test data input buffer, and the memory controller. The control circuit further includes a state machine circuit configured to control the buffer controller and the memory controller responsive to the one or more control signals stored in the control register.

According to some method embodiments of the present invention, methods are provided for testing a memory device including a non-volatile memory core including a memory cell array and a page buffer configured to store data to be programmed in the memory cell array, and a test data input buffer configured to receive test data from an external source. Test data is loaded from the test data buffer to the page buffer. The memory cell array is programmed with the loaded test data in the page buffer. The programmed test data is retained in the page buffer, and the memory cell array is subsequently programmed with the retained test data. For example, programming the memory cell array with the retained test data may include re-programming the memory cell array with the retained test data responsive to a programming failure. In further embodiments, programming the memory cell array with the loaded test data in the page buffer comprises programming a first set of memory cells, and programming the memory cell array with the retained test data comprises programming a second set of memory cells.

DETAILED DESCRIPTION OF EXEMPLARY EMBODIMENTS

The present invention will now be described more fully with reference to the accompanying, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In exemplary test methods for nonvolatile memory devices according some embodiments of the present invention, test data is stored in a buffer of a semiconductor memory device, instead of externally loading test data whenever memory cells are programmed during their test. The stored test data is selectively loaded on a page buffer. Because memory cells may be programmed by iteratively using the stored data, time required for externally loading data may be shortened. After the programming is conducted, the data loaded on the page buffer may be retained to reduce data loading between an internal buffer and a page buffer.

Figure 1:
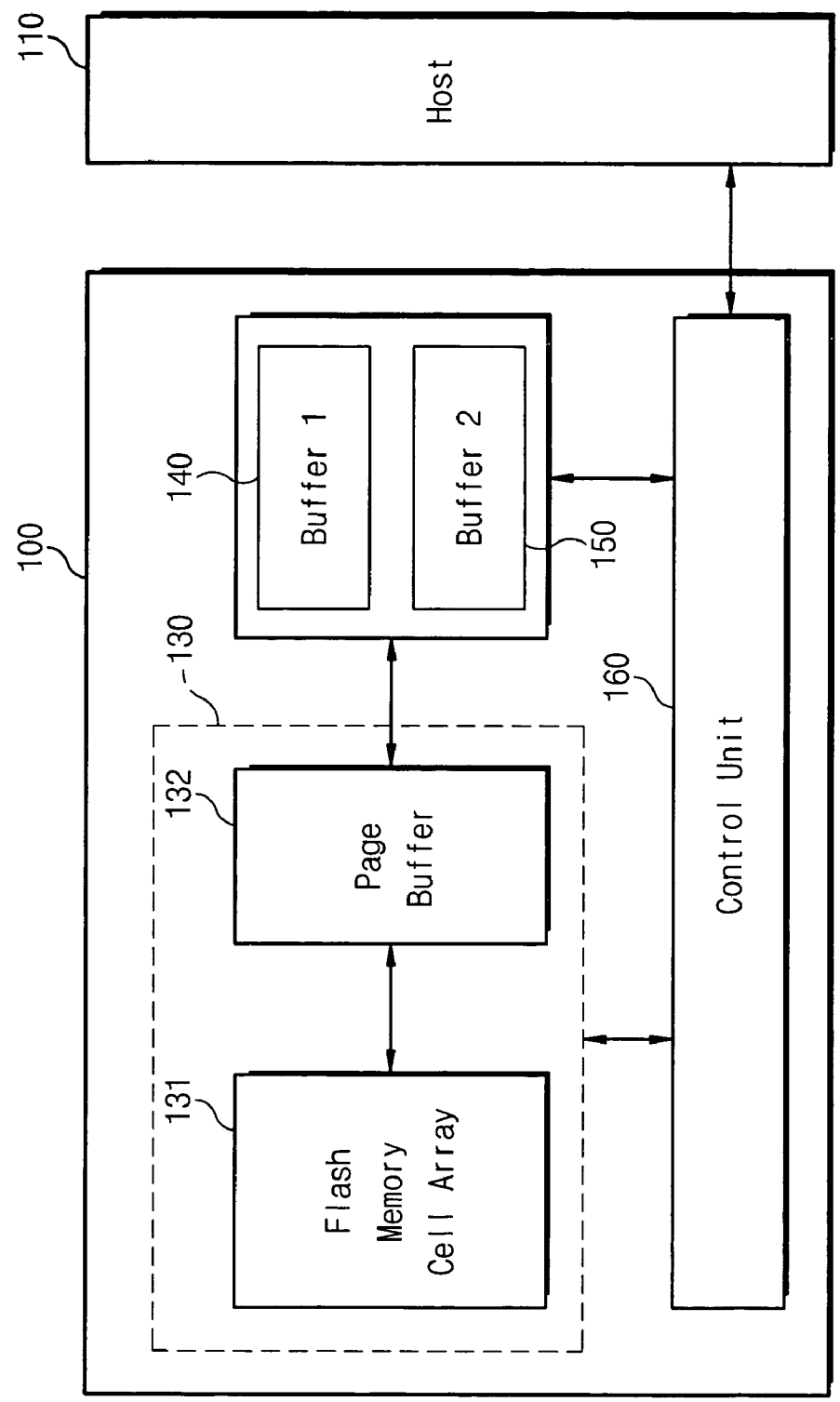
FIG. 1 is a block diagram of a data processing system including a semiconductor memory device according to some embodiments of the present invention.

As illustrated in FIG. 1, a data processing system includes a semiconductor memory device 100 and a host 110. The memory device 100 is a flash memory device including circuitry for multiple functions. The host 110 stores test data in the memory device 100 and causes the memory device 100 to process the test data to test the memory device 100. The host 110 also analyzes test results obtained from the memory device 100 to determine whether the memory device 100 is defective. Exemplary configurations and test operations for the flash memory device will now be described.

The memory device 100 stores data and/or outputs the stored data under control of the host 110. During a test operation, the memory device 100 outputs a test result under control of the host 110. A test may be performed using test data which is previously stored in the memory device 100.

The memory device 100 includes a flash core 130, first and second buffers 140 and 150, and a control unit 160. The flash core 130 includes a flash memory cell array 131 and a page buffer 132. Test data TDATA_IN, an address of a buffer, and a control signal are input from the host 110. The memory device 100 receives the test data TDATA_IN from the host 110 through the control unit 160 and stores the received test data in a corresponding address of the first buffer 140. The test data is conveyed to the first buffer 140 via a normal data path.

At the start of a test, an address of a flash cell to be tested and a control signal are input from the host 110. In response, the test data TDATA_IN stored in the first buffer 140 is loaded into the page buffer 132 under control of the control unit 160. The data loaded in the page buffer 132 is programmed to a flash cell to be tested. The test data TDATA_IN may be programmed to one or more pages included in the cell array 131 or to an entire flash memory cell array 131. After the test data TDATA_IN are programmed, the control unit 160 reads out the programmed data as a test result TDATA_OUT, which is stored in the second buffer 150. The control unit 160 outputs the test result TDATA_OUT stored in the second buffer 150 to the host 110.

The first and second buffers 140 and 150 may be static random access memories (SRAMs) or other random access memories. The test data TDATA_IN is stored in the first buffer 140, and the test result TDATA_OUT is stored in the second buffer 150. For a typical NAND flash memory, data of one page is programmed. Therefore, the first and second buffers 140 and 150 may have a capacity (e.g., 2 KB) sufficient to store data for at least one page. However, it will be understood that these sizes of the first and second buffers 140 and 150 are merely exemplary and that the buffers may have different sizes.

The test data TDATA_IN stored in the first buffer 140 may be arranged such that different patterns are stored in each sector (e.g., 512 bytes). The test data TDATA_IN stored in the first buffer 140 is independently loaded on a flash memory at each sector (512B). If the size of total data of a sector selected for test is larger than the total size of the page buffer 132, the test data of the selected sector may be iteratively loaded until the page buffer 132 is filled. Thus, various test patterns may be stored using a relatively low capacity first buffer 140.

The test data loaded on the page buffer 132 is not reset when a programming operation is conducted. Rather, the loaded data is maintained until input of a specific command, e.g., a page buffer reset inhibit release command. As a result, repeated tests may be conducted by iteratively using the data stored in the page buffer 132 without loading data in the semiconductor device 100 from an external source.

Figure 2:
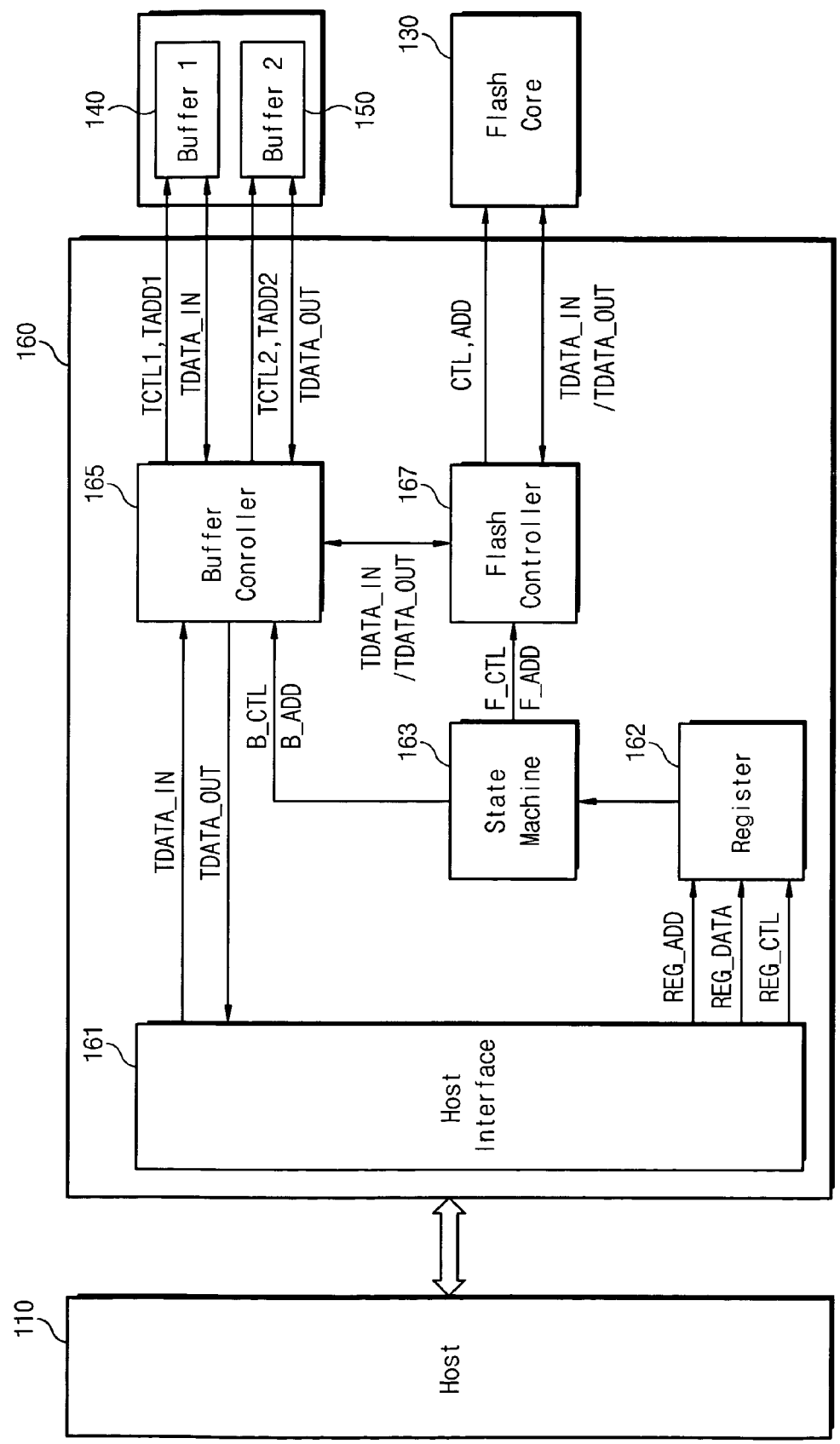
FIG. 2 is a block diagram showing a configuration of a control unit shown in FIG. 1

As illustrated in FIG. 2, an exemplary implementation of a control unit 160 includes a host interface 161, a register 162, a state machine 163, and a flash controller 167. The host interface 161 acts as an interface between the host 110 and the memory device 100. The host interface 161 receives test data TDATA_IN, an address of a buffer or a flash cell, and a control signal, and outputs a result of test conducted in the memory device 100 to the host 110 in response to the control signal. The host interface 161 may have any of a variety of configurations. For example, the host interface 161 may have a flash memory interface and/or a NOR flash memory interface.

The register 162 is used to store an address REG_ADD and a command REG_CTL transmitted from the host 110 through the host interface 161. The command REG_CTL transmitted from the host 110 is defined by a combination of control signals. Register data RAG_DATA is stored in an area of the register 162 corresponding to the register address REG_ADD. The register data RAG_DATA includes addresses of first and second buffers 140 and 150, an address of a flash memory, and read/write commands.

The memory device 100 has a normal mode and a test mode. In response to the control signal REG_CTL, the state machine 163 generates addresses B_ADD and F_ADD and control signals B_CTL and F_CTL to control operations of the buffer controller 165 and the flash controller 167. The buffer controller 165 controls read/write operations for test data relative to the first and second buffers 140 and 150 in response to the address B_ADD and the control signal B_CTL generated from the state machine 163. The flash controller 167 controls read/write operations for test data relative to a memory core 130 in response to the address F_ADD and the control signal F_CTL generated from the state the state machine 163.

The buffer controller 163 stores the test data TDATA_IN responsive to the address B_ADD and the control signal B_CTL, which are input from the state machine 163 before a test is conducted. If the memory device 100 is in test mode, the buffer controller 162 reads out the test data TDATA_IN stored in a specific sector of the first buffer 140 in response to the address B_ADD and the control signal B_CTL input from the state machine 163. The buffer controller 165 outputs the read-out test data TDATA_IN to the flash controller 167.

The flash controller 167 programs the test data TDATA_IN to the flash core 130 in response to the address F_ADD and the control signal F_CTL input from the state machine 163. After programming is complete, the flash controller 167 reads out a programmed result TDATA_OUT from the flash core 130 and transmits the programmed result TDATA_OUT to the buffer controller 165.

Figure 3:
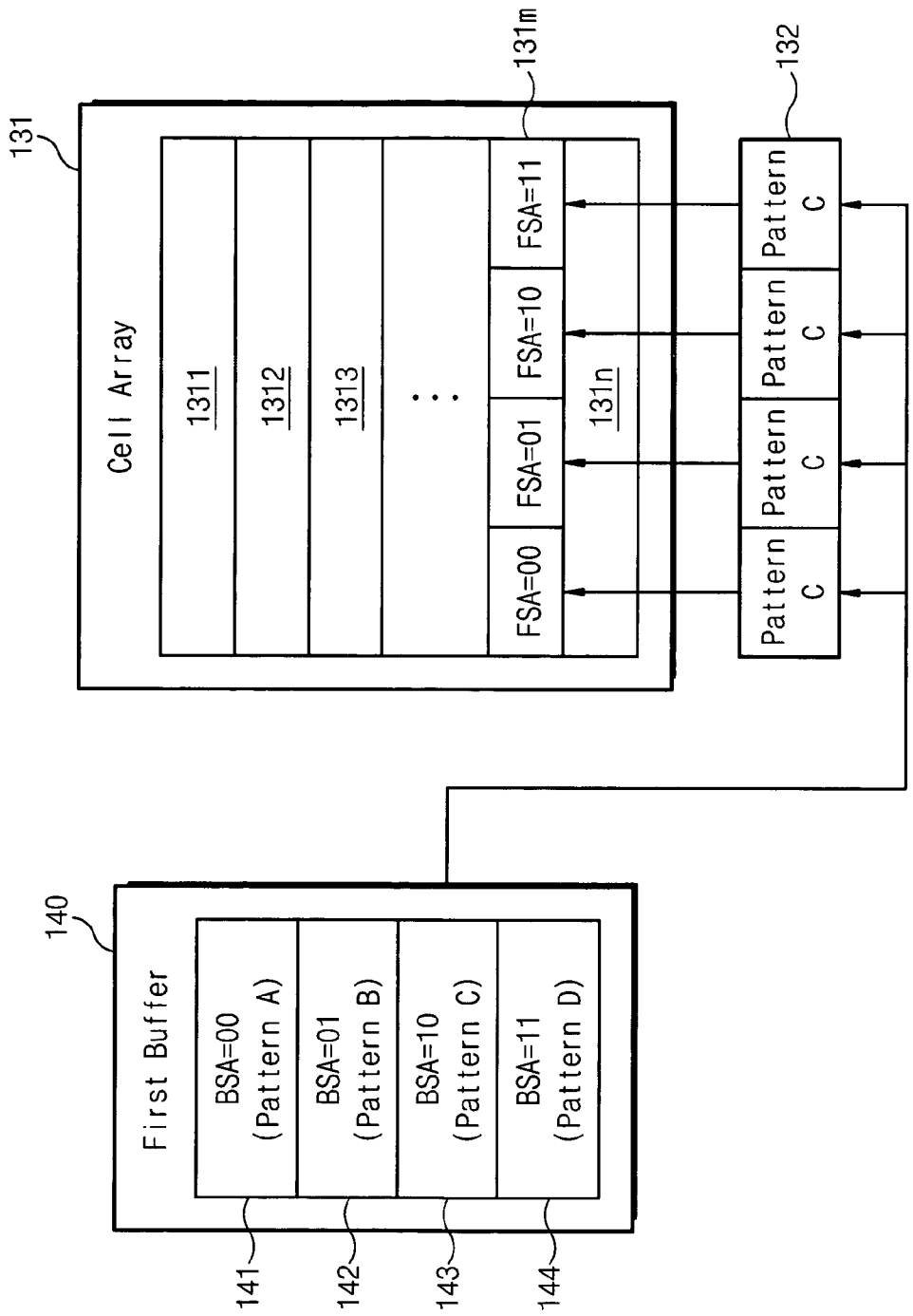
FIG. 3 shows an example of programming using test data stored in a first buffer shown in FIG. 2.

FIG. 3 illustrates an example of programming using test data TDATA_IN stored in a first buffer 140 shown in FIG. 2. In FIG. 3, one block (e.g., a 1024 blocks or 2048 block) of a cell array 131 of a flash memory is illustrated. The block includes a plurality of pages 1311, 1312, ..., 131*m*, and 131*n*, each serving as a basic unit for data write/read operations and each having a plurality of sectors.

FIG. 3 illustrates an example with one page divided into four sectors. In the illustrated flash memory, a page size is 2K+64 bytes and a sector size is 512+16 bytes. Each sector has an address that is called a flash sector address (FSA). For example, an address of a first buffer sector is '00', which is represented as 'BSA=00'; an address of a second buffer sector is '01', which is represented as 'BSA=01'; an address of a third buffer sector is '10', which is represented as 'BSA=10'; and an address of a fourth buffer sector is '11', which is represented as 'BSA=11'.

In the first buffer 140, different test data patterns Pattern A, Pattern B, Pattern C, and Pattern D are stored in respective sectors. Each of the test data patterns Pattern A, Pattern B, Pattern C, and Pattern D is independently loaded on a page buffer 132 at each sector. For example, as shown in FIG. 3, if C-pattern test data stored in a third buffer sector is to be programmed to mth page 131*m*, it is first loaded on a page buffer 132. As the total size of the data stored in a selected buffer sector is smaller than that of the page buffer 132, test data of a selected sector is iteratively loaded until the page buffer 132 is filled. In this case, one or more sectors may be selected simultaneously, and various test patterns may be made using combinations of test data included in selected sectors.

The first buffer 140 and the respective pages are addressed using address data stored in the register 162. The test data loaded on the page buffer 132 is used to program a page included in a cell array 131 or to successively program a plurality of pages. For example, if the data loaded on the page buffer 132 is used to program a plurality of pages, test data is not loaded from the first buffer 140 but existing data loaded on the page buffer 132 is used when a program operation is performed. The flash controller 167 causes the test data stored in the page buffer 132 to not be reset after a program operation is performed. As a result, duplicate data loading between the first buffer 140 and the page buffer 132 may be omitted to shorten test time. Such a reset inhibit set function for the page buffer 132 is performed depending upon whether test data is to be re-used.

The data reset inhibit set and release functions for the page buffer 132 may be provided by a dual latch (not shown) in the page buffer 132. For example, the first page buffer 132 may include a first latch for storing data loaded from the first buffer 140 and a second latch for internally dumping to store the data stored in the first latch. If the test data is loaded from the first buffer 140, loading of data from the first buffer 140 to the first latch is inhibited. The first latch retains the loaded data until the loading inhibit function is released and new data is loaded from the first buffer 140. The data loaded to the first latch is dumped to the second latch.

The second latch serves to store data that is programmed to a cell array. After verifying the programmed data, the second latch dumps the data stored in the first latch. As a result, the data loaded on the page buffer 132 is maintained even after being programmed. By using such internal data transfer between the first and second latches, the data stored in the page buffer is maintained until a data reset inhibit for the page buffer 132 is deactivated. The above-described configuration of the page buffer 132 is merely exemplary and may vary within the scope of the present invention.

Figure 4:
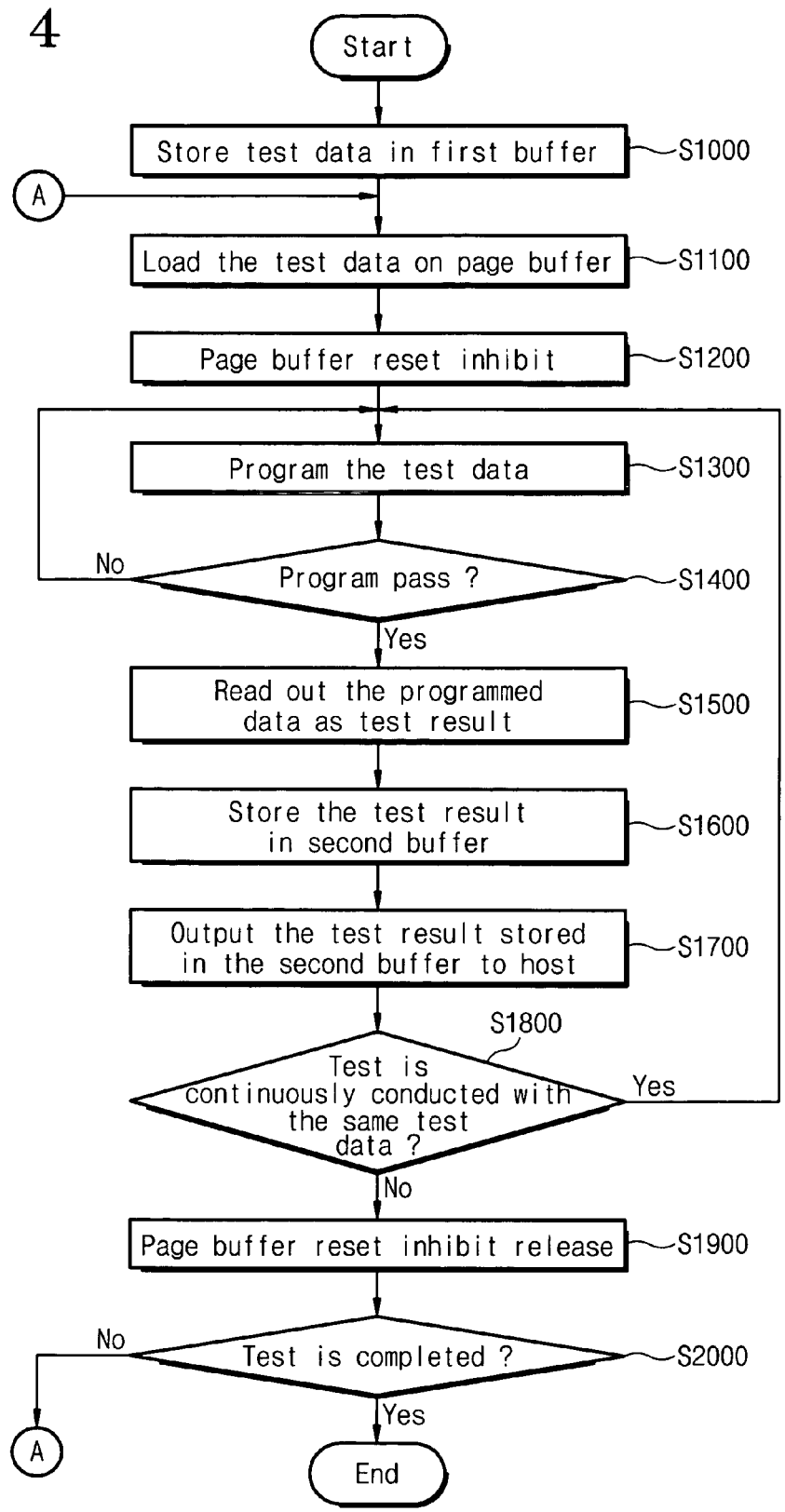
FIG. 4 is a flowchart showing test operations according to the present invention.

FIG. 4 is a flowchart showing exemplary test operations according to some embodiments of the present invention. Sometime prior to testing, test data TDATA_IN is stored in the first buffer 140 of the memory device 100 (S1000). The first buffer 140 may be a random access memory, such as an SRAM. Instead of receiving test data from an external source during test, the test data TDATA_IN stored beforehand in the first buffer 140 is internally loaded to perform the programming. Therefore, it is possible to shorten an external interface time required for allowing the memory device 100 to receive data from a host 110.

Test data including different patterns for each sector unit (e.g., 512 bytes) is stored in the first buffer 140. The test data stored in the first buffer 140 corresponding to a sector is loaded on a page buffer 132 (S1100). After the test data is loaded on the page buffer 132, a page buffer reset inhibit function is activated (S1200). The page buffer reset inhibit function prevents data stored in a page buffer 132 from being reset after being programmed. Due to the page buffer reset inhibit function, once-loaded data may be used repeatedly without reloading data on the page buffer 132. Thus, internal data loading time between the first buffer 140 and the page buffer 132 may be shortened.

The test data stored in the page buffer 132 is programmed to the cell array 131. Thereafter, the programming is verified (S1400). After a verify operation is performed, data stored in the page buffer 132 may be reset to a '1' or '0' value. However, as described above, because the page buffer 132 may include two latches, test data stored in a first latch may be internally dumped to a second latch even if the second latch is reset by a verify operation. As a result, the data loaded on the page buffer 132 may be preserved.

If the programming fails S1400, programming is re-conducted (S1300). Because the data loaded in step S1100 is stored in the page buffer 132 without being reset, the data loaded on the page buffer 132 is used without reloading the test data from the first buffer 140. If the programming is successful, a result programmed to a cell array 131 is read out as a test result TDATA_OUT (S 1500). The read-out test result is stored in a second buffer 150 (S1600). Similar to the first buffer 140, the second buffer 150 may be an SRAM.

The test result TDATA_OUT stored in the second buffer 150 is output to the external host 110 (S1700). Whenever a page is programmed, the test result TDATA_OUT may be output to the host 110. Alternatively, test results for a plurality of pages may be output together as commanded by the host 110. The manner in which the test result TDATA_OUT is output may vary with a capacity of the second buffer 150 and the interface with the host 110. After the test result TDATA_OUT is output, the test data loaded on the page buffer 132 is used to determine whether another test is to be conducted with this data (S1800).

If the test is conducted using the test data loaded on the page buffer 132 in step S1800, this routine proceeds to step S1300 in which the test data loaded on the page buffer 132 is used to conduct the test without reloading the test data on the page buffer 132.

If the test is conducted not using the test data loaded on the page buffer 132 in step S1800, the page buffer reset inhibit is released (S1900). Thereafter, it is determined whether the test is complete (S2000). If the test is not complete, the routine returns to step S1100 in which another test data pattern stored in the first buffer 140 is selected and the selected test data is loaded on the page buffer 132. Thereafter, the steps 1200 to 2000 are repeated for this pattern. If the test is complete at step S2000, the routine ends.

In test operations according to some embodiments of the present invention, instead of externally loading test data when a memory cell is programmed, test data is pre-stored in a buffer of a semiconductor memory device. The pre-loaded test data is selectively used to program a memory cell. As a result, loading time for the test data may be shortened to enhance test efficiency.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A memory device, comprising:
    a non-volatile memory core comprising a memory cell array and a page buffer configured to store data to be programmed in the memory cell array;
    a test data input buffer configured to receive test data from an external source; and
    a control circuit that controls the non-volatile memory core and the test data input buffer, the control circuit configured to load test data from the test data buffer to the page buffer, to program the loaded test data in the page buffer in the memory cell array, and to retain the test data in the page buffer for subsequent programming of the memory cell array.

2. A device according to claim 1, wherein the control circuit is operative to re-program memory cells in the memory cell array with the retained test data in the page buffer responsive to a programming failure.

3. A device according to claim 1, wherein the control circuit is operative to program a first set of memory cells of the memory cell array with the loaded test data in the page buffer to test the first set of memory cells, and wherein the control circuit is further operative to program a second set of memory cells of the memory cell array with the retained test data to test the second set of memory cells.

4. A device according to claim 1, wherein the page buffer retains the test data until a reset inhibit function of the page buffer is deactivated.

5. A device according to claim 1, wherein the control circuit is configured to store respective test data patterns in the test data input buffer, to transfer multiple numbers of at least one of the test data patterns to the page buffer and to program the memory cell array with the multiple numbers of the at least one of the test data patterns.

6. A device according to claim 1, wherein the control circuit comprises:
    an interface circuit configured to receive test data and one or more control signals from the external source; and
    a control register configured to store the one or more control signals;
    a memory controller configured to program and read the non-volatile memory core;
    a buffer controller configured to transfer test data among the interface circuit, the test data input buffer, and the memory controller; and
    a state machine circuit configured to control the buffer controller and the memory controller responsive to the one or more control signals stored in the control register.

7. A device according to claim 1, further comprising a test data output buffer configured to receive data read from the memory cell array, and wherein the control circuit is further operative to convey the read data from the test data output buffer to an external recipient.

8. A device according to claim 7, wherein the test data output buffer comprises random access memory.

9. A device according to claim 1, wherein the test data input buffer comprises random access memory.

10. A method of testing a memory device including a non-volatile memory core including a memory cell array and a page buffer configured to store data to be programmed in the memory cell array and a test data input buffer configured to receive test data from an external source, the method comprising:
    loading test data from the test data buffer to the page buffer;
    programming the memory cell array with the loaded test data in the page buffer;
    retaining the programmed test data in the page buffer; and then
    programming the memory cell array with the retained test data.

11. A method according to claim 10, wherein programming the memory cell array with the retained test data comprise re-programming the memory cell array with the retained test data responsive to a programming failure.

12. A method according to claim 10, wherein programming the memory cell array with the loaded test data in the page buffer comprises programming a first set of memory cells, and wherein programming the memory cell array with the retained test data comprises programming a second set of memory cells.

13. A method according to claim 10, wherein retaining the programmed test data in the page buffer comprises retaining the programmed test data until a reset inhibit function of the page buffer is released.

14. A method according to claim 10, wherein loading test data from the test data buffer to the page buffer is preceded by storing respective test data patterns in the test data input buffer, wherein loading test data from the test data buffer to the page buffer comprises transferring multiple numbers of at least one of the test data patterns to the page buffer, and wherein programming the memory cell array with the loaded test data in the page buffer comprises programming the memory cell array with the multiple numbers of the at least one of the test data patterns.

15. A method according to claim 10, further comprising storing data read from the memory cell array in a test data output buffer and conveying the stored data from the test data output buffer to an external recipient.

* * * * *